(12) United States Patent
Filippi et al.

(10) Patent No.: US 9,287,186 B2
(45) Date of Patent: *Mar. 15, 2016

(54) METHOD AND STRUCTURE FOR DETERMINING THERMAL CYCLE RELIABILITY

(75) Inventors: Ronald Gene Filippi, Wappingers Falls, NY (US); Jason Paul Gill, Essex, VT (US); Vincent J. McGahay, Poughkeepsie, NY (US); Paul Stephen McLaughlin, Poughkeepsie, NY (US); Conal Eugene Murray, Yorktown Heights, NY (US); Hazara Singh Rathore, Stormville, NY (US); Thomas M. Shaw, Peekskill, NY (US); Ping-Chuan Wang, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 821 days.

This patent is subject to a terminal disclaimer.

(21) Appl. No.: 12/128,260

(22) Filed: May 28, 2008

(65) Prior Publication Data

US 2008/0224135 A1    Sep. 18, 2008

Related U.S. Application Data

(60) Continuation of application No. 11/502,196, filed on Aug. 10, 2006, now Pat. No. 7,388,224, which is a division of application No. 10/783,462, filed on Feb. 20, 2004, now Pat. No. 7,098,054.

(51) Int. Cl.
*H01L 23/58* (2006.01)
*H01L 21/66* (2006.01)
(Continued)

(52) U.S. Cl.
CPC ............... *H01L 22/34* (2013.01); *H01L 22/32* (2013.01); *H01L 23/5226* (2013.01);
(Continued)

(58) Field of Classification Search
CPC .................. H01L 22/34; H01L 22/32; H01L 2924/01079; H01L 2924/010143; H01L 23/5226; H01L 23/481; H01L 23/562; Y01T 29/49004; H05K 1/0268; H05K 1/0269; H05K 1/092; H05K 1/116; H05K 3/1225
USPC ............ 257/E23.002, 48, 774, 773, 776, 758; 438/18, 638, 11, 14, 15
See application file for complete search history.

(56) References Cited

U.S. PATENT DOCUMENTS 6,391,669 B1 *   5/2002   Fasano et al. ................. 438/18
6,417,566 B1 *   7/2002   Wang et al. ................... 257/750
(Continued)

OTHER PUBLICATIONS

Suzuki et al., "Stress Induced Failure Analysis by Stress Measurements in Copper Dual Damascene Interconnects," Proceedings of the IEEE 2002 International Interconnect Technology Conference, Jun. 3-5, 2002, pp. 229-230.*
(Continued)

*Primary Examiner* — Thinh T Nguyen
(74) *Attorney, Agent, or Firm* — Michael Le Strange; Hoffman Warnick LLC

(57) ABSTRACT

A device and method for evaluating reliability of a semiconductor chip structure built by a manufacturing process includes a test structure built in accordance with a manufacturing process. The test structure is thermal cycled and the yield of the test structure is measured. The reliability of the semiconductor chip structure built by the manufacturing process is evaluated based on the yield performance before the thermal cycling.

10 Claims, 8 Drawing Sheets

(51) Int. Cl.
*H01L 23/522* (2006.01)
*H01L 23/00* (2006.01)
*H05K 1/09* (2006.01)
*H05K 1/02* (2006.01)

(52) U.S. Cl.
CPC .......... *H01L 23/562* (2013.01); *H05K 1/0268* (2013.01); *H05K 1/0269* (2013.01); *H05K 1/092* (2013.01); *Y10S 438/927* (2013.01); *Y10T 29/49004* (2015.01)

(56) References Cited

U.S. PATENT DOCUMENTS

| | | | | |
|---|---|---|---|---|
| 6,613,664 | B2* | 9/2003 | Barth et al. | 438/629 |
| 6,683,465 | B2* | 1/2004 | Fetterman et al. | 324/719 |
| 6,864,701 | B2* | 3/2005 | Yao et al. | 324/762.01 |
| 6,958,542 | B2* | 10/2005 | Hasunuma et al. | 257/758 |
| 7,388,224 | B2* | 6/2008 | Filippi et al. | 257/48 |
| 2004/0129938 | A1* | 7/2004 | Landers et al. | 257/48 |
| 2004/0207383 | A1* | 10/2004 | Wang | 324/71.2 |

OTHER PUBLICATIONS

U.S. Appl. No. 10/726,140, Habib Hichri et al.

Hance H. Huston and C. Patrick Clarke; "Reliability Defect Detection and Screening during Processing—Theory and Implementation"; IEEE/IRPS; Jan. 1992; pp. 268-275.

R. G. Filippi et al.; "Thermal Cycle Reliability of Stacked via Structures with Copper Metallization and an Organic Low-K Dielectric"; sent in Oct. 2003 to International Reliability Physics Symposium committee for later publishing (not yet published as of date filing this IDS); 4 pages (including 2004 IRPS Submission Cover-Page and article).

* cited by examiner

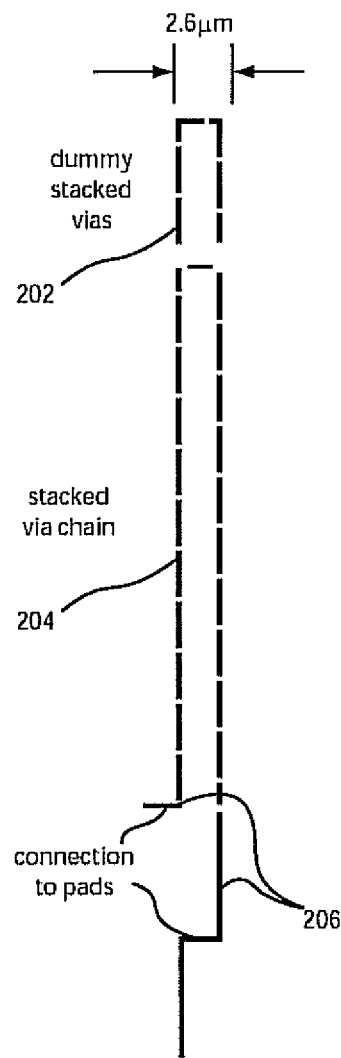
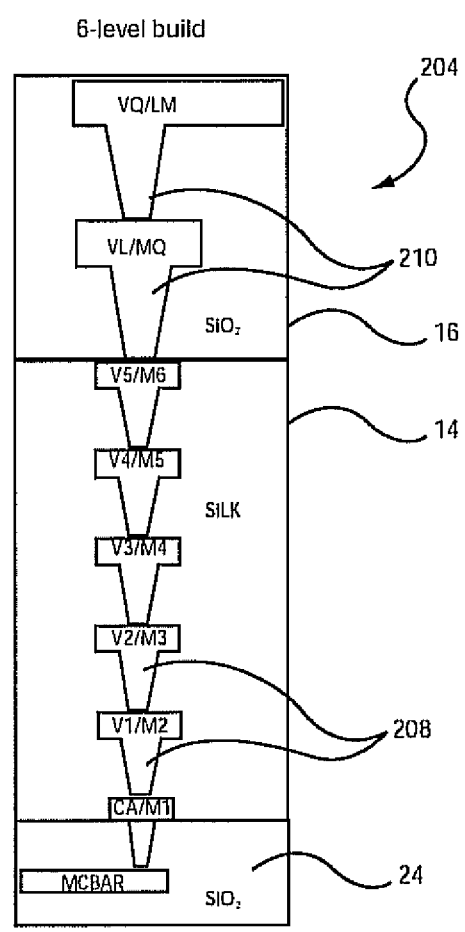
FIG. 8A                    FIG. 8B

METHOD AND STRUCTURE FOR DETERMINING THERMAL CYCLE RELIABILITY

RELATED APPLICATION INFORMATION

This application is a continuation of U.S. patent application Ser. No. 11/502,196, filed Aug. 10, 2006 (U.S. Pat. No. 7,388,224, issued on Jun. 17, 2008), which is a divisional application of U.S. patent application Ser. No. 10/783,462, filed Feb. 20, 2004 (U.S. Pat. No. 7,098,054, issued on Aug. 29, 2006).

BACKGROUND OF THE INVENTION

1. Field of the Invention

The present invention relates to semiconductor processing, and more particularly to a system and method for addressing thermal mismatch between organic dielectrics and metals.

2. Description of the Related Art

Reliability under thermal cycle conditions is one of the main concerns when integrating Back End of Line (BEOL) structures with low dielectric constant dielectrics. The cause of thermal cycle fails is typically the mismatch in the coefficients of thermal expansion (CTE) between the metallization and the surrounding insulator. For example, the CTE of copper (Cu) is approximately 16 ppm/° C. while that of SILK (trademark of Dow Chemical) is approximately 60 ppm/° C. As a result, the Cu metallization is strained during thermal cycle testing, which can lead to crack formation in Cu vias and eventual failure. While the thermal cycle performance of a given process can be evaluated by stressing specifically designed test structures, such as stacked via chains, this can only be done on a limited sampling of parts and only on complete builds of the structure.

It would be highly desirable to have a method for determining the thermal cycle performance provided by a manufacturing process.

SUMMARY OF THE INVENTION

A device and method for evaluating reliability of a semiconductor chip structure built by a manufacturing process includes a test structure built in accordance with a manufacturing process. The test structure is thermal cycled and the yield of the test structure is measured. The reliability of the semiconductor chip structure built by the manufacturing process is evaluated based on the yield performance before the thermal cycling.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein:

FIGS. 8A and 8B show a layout and schematic, respectively, for a stacked via chain having uniform via strain;

DETAILED DESCRIPTION OF PREFERRED EMBODIMENTS

Figure 1:
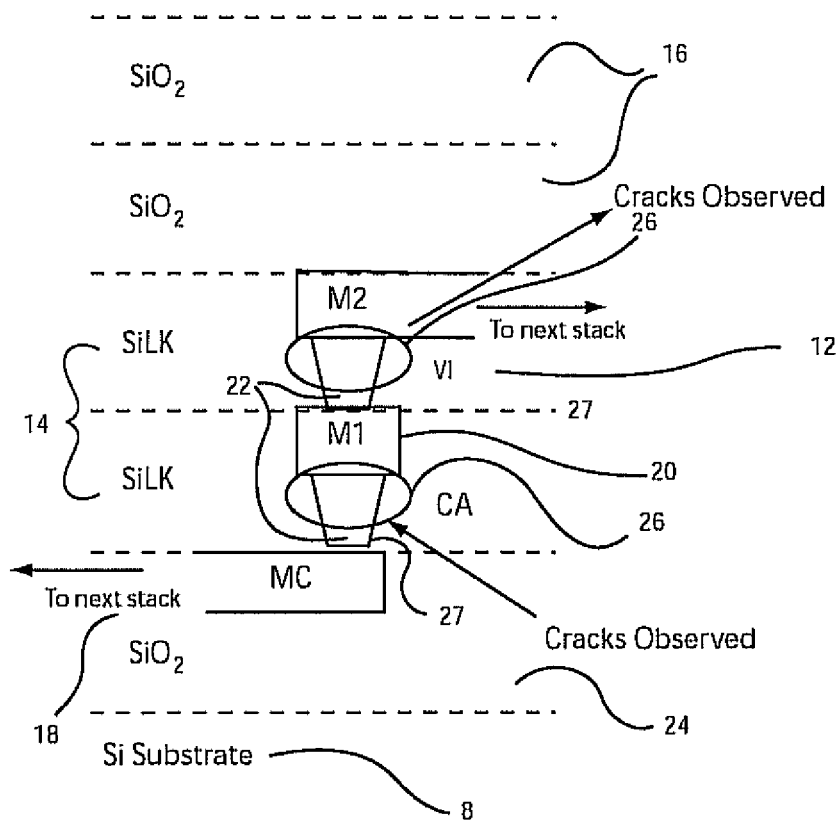
FIG. 1 is a schematic cross-sectional view of a test structure in accordance with one embodiment of the present invention.

The present invention provides a system and method for applying a yield parameter to determine thermal cycling failures. The present invention identifies, for example, the yield of Dual Damascene interconnects as a parameter that directly correlates with the thermal cycle reliability of via stacks during thermal cycling. In addition, these via chains are typically designed without regard to the layout surrounding the actual structures. It is to be noted that a Dual Damascene process is a commonly used technique for fabricating metal interconnects.

Since the thermal strain in a via is directly affected by the material surrounding the via, the probability of failure in such conventional structures may vary across the via chain. This makes reliability assessments for actual product layouts nearly impossible. In addition, if the metal fill surrounding the test structure is relatively high, then it is unlikely to obtain a significant number of failures during a thermal cycle stress. This prevents determining of statistical behavior of thermal cycle failures and making projections for operating conditions.

The present invention further provides several illustrative stacked via designs that avoid these problems and thus can be used for evaluating the thermal cycle performance provided by a manufacturing process.

In one embodiment, the yield of Dual Damascene interconnects is used as a measure of the thermal cycle performance. This can be used to control the thermal cycle behavior of BEOL structures. Data shows that the yield provides a sensitive way to determine when process conditions fall outside a window that assures thermal cycle reliability during the manufacture of BEOL structures.

In another embodiment, designs of stacked via chains are employed to accurately assess the thermal cycle performance of a given process. Since the thermal strain of any via in the chain is dependent on the precise geometric layout (e.g., distance between via stacks, location of the chain relative to the bond pads, etc.), it may be important to design the structure such that there is a uniform value of strain across all of the vias in the chain. The uniform via strain ensures that each via has approximately the same probability of failure. This may be accomplished by including dummy vias, which are not electrically connected to the actual test structure, in the design of the stacked via chain. These dummy vias may be located near the end of the chain and essentially share the stress with the electrically active vias.

In addition, certain designs are more susceptible to thermal cycle failure (e.g., structures without via fill), and thus would be useful in generating a sufficient number of failures for modeling purposes. Since isolated vias are more susceptible to thermal cycle failure compared to nested vias, it is necessary to isolate the vias from regions of dense metal features. In this case, it may also be important that the distance between the structure and bond pads is sufficiently large since bond pads represent areas of high metal fill density.

Referring now in detail to the figures in which like numerals represent the same or similar elements and initially to FIG. 1, a schematic cross section of a structure 10 used for thermal cycle study in accordance with one embodiment of the present invention is shown. The test structure 10 (also referred to as a "stacked via chain") is employed to verify the stability of, e.g., SiLK™/Cu BEOL structures during thermal cycling. It should be noted that other metals and dielectric materials may be employed in addition to or instead of the SiLK™/Cu materials illustratively described herein. For example dielectrics such as SiCOH, nitrides, silicon dioxide or other organic or inorganic dielectrics may be employed.

The structure 10 includes a stacked via chain 12, where two SiLK™ levels 14 (e.g., levels M2/V1, and M1/CA) are followed by two silicon dioxide ($SiO_2$) levels 16. The chain 12 may include, e.g., 50 links, alternating between layer MC, which may include a tungsten (W) local interconnect 18, and M2. Other numbers of links and configurations are also contemplated.

Structure 10 preferably includes a dual damascene structure to provide stress risers at the interface between vias 22 (CA and V1) and adjacent metal. Other structures that can fail due to thermal induced strain may also be employed. M1 may include a square plate 20. In one example, plate 20 measures about 0.35 μm on a side while CA and V1 measure about 0.22 μm in diameter.

Thermal cycle failure is a result of metal fatigue, a phenomenon described by crack formation and growth due to cyclic strain. During thermal cycle testing, layers 14 (e.g., SiLK™) expand and contract significantly, generating large stresses in vias 22 (e.g., CA and V1). The resulting via strain is enhanced by the mechanical confinement of the rigid $SiO_2$ layers above (16) and below (24) the metallization. Layers 24 in this case being formed on a substrate 8, which may include, for example, a silicon or silicon-on-insulator material. Eventually, cracks are initiated in regions 26 and propagate across the vias 22 (e.g., formed from Cu), causing a resistance increase if the cracks reach a critical size. An electrical open occurs if the cracks compromise liner integrity for liners 27 formed on sides and bottoms of vias 22.

In one embodiment, the structure 10 includes aluminum (Al), copper (Cu), Gold (Au), silver (Ag), or alloys thereof as metal and, the dielectric may include an organic material, such as SiLK™ or polyimide. A liner material 27 may include tantalum (Ta), tantalum nitride (TaN), titanium (Ti), titanium nitride (TiN) or tungsten (W). The liner material is deposited prior to filling via holes with metal. The mismatch in CTE between the metal and insulator is preferably greater than about 20 ppm/° C.

Method for Evaluating the Thermal Cycle Performance

By comparing two different processes, e.g., Phase A and Phase B, a one to one correspondence between the yield of the structure and the relative number of early fails that occurred during thermal cycle testing was discovered by the inventors. Phase A and Phase B processes may include any fabrication process. In the present example, these processes include liner deposition processes.

Figure 2:
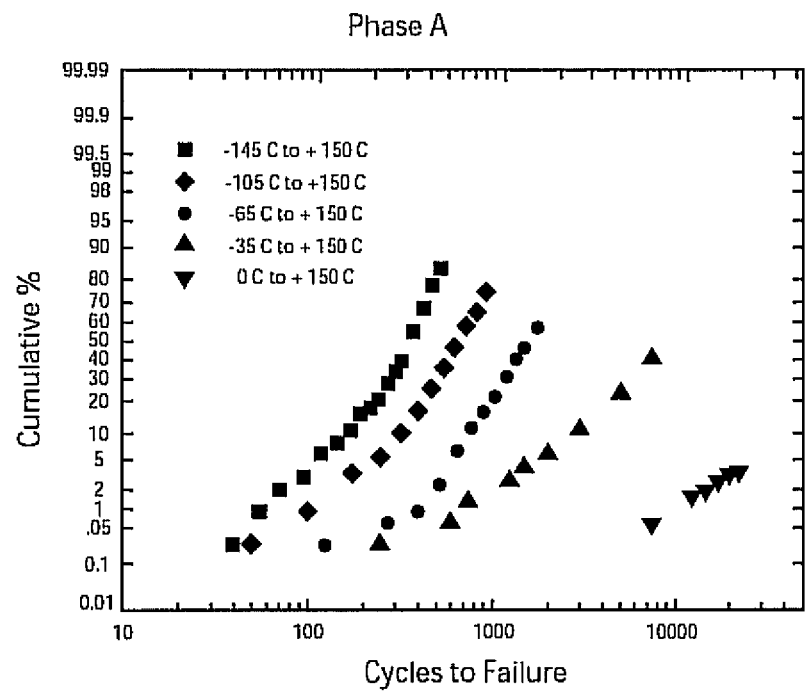
FIG. 2 is a log normal cumulative distribution function (CDF) plot of cumulative percent of thermal cycles versus cycles to failure for an illustrative liner process (phase A)

Referring to FIG. 2 for the Phase A process, a lognormal cumulative distribution function (CDF) plot in terms of the cycles to failure for different temperature ranges from the phase A hardware is shown. If one failure mode is present, thermal cycle data is described by the two-parameter lognormal distribution. In this case, the parameters are the median cycles to failure, $N_{50}$, and the shape of the distribution, sigma. It is clear from FIG. 2 that most of the stress cells have multiple failure distributions. Specifically, the failure distributions are comprised of two failure modes, referred to as early and late failures. For example, in the case of the −65° C. to +150° C. stress cell, the early fails occur before 400 cycles while the late fails occur after 400 cycles.

To accurately describe this type of failure data, it is necessary to use a bimodal lognormal failure distribution. Such a distribution includes, e.g., 5 parameters, including separate $N_{50}$ and sigma values for the early and late failures as well as a parameter corresponding to the fraction of samples in the total population that are early fails.

Figure 3:
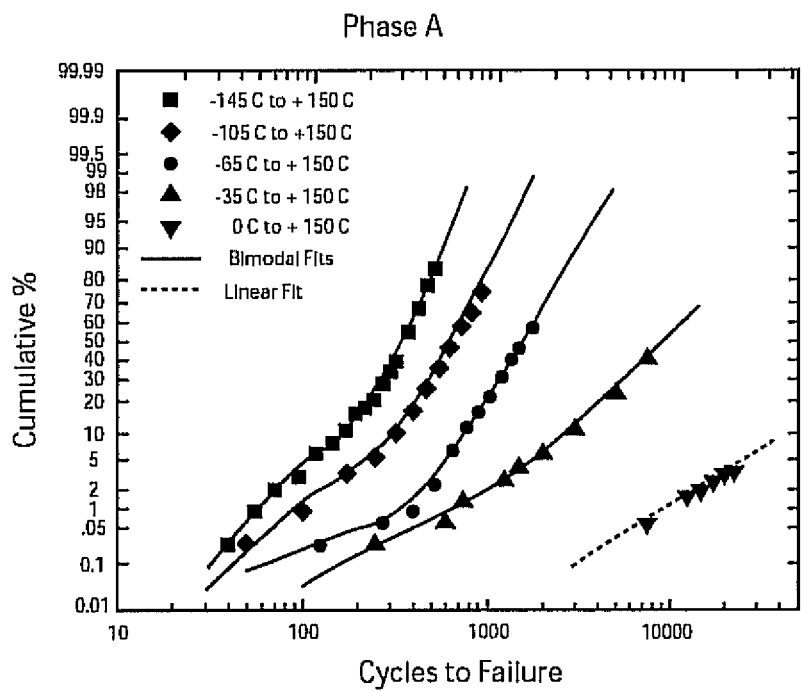
FIG. 3 is the plot of FIG. 2 with bimodal and linear fits for the curves.

Referring to FIG. 3, a lognormal CDF plot for the same data shown in FIG. 2, along with the corresponding bimodal fits is illustratively shown. FIG. 3 shows good agreement between the bimodal fits and the actual failure data for each of the stress cells described previously with reference to FIG. 2. Only early fails occur for the 0° C. to +150° C. stress cell at the time the experiment was completed, so a linear fit based on the two-parameter lognormal distribution is indicated for this data.

Figure 4:
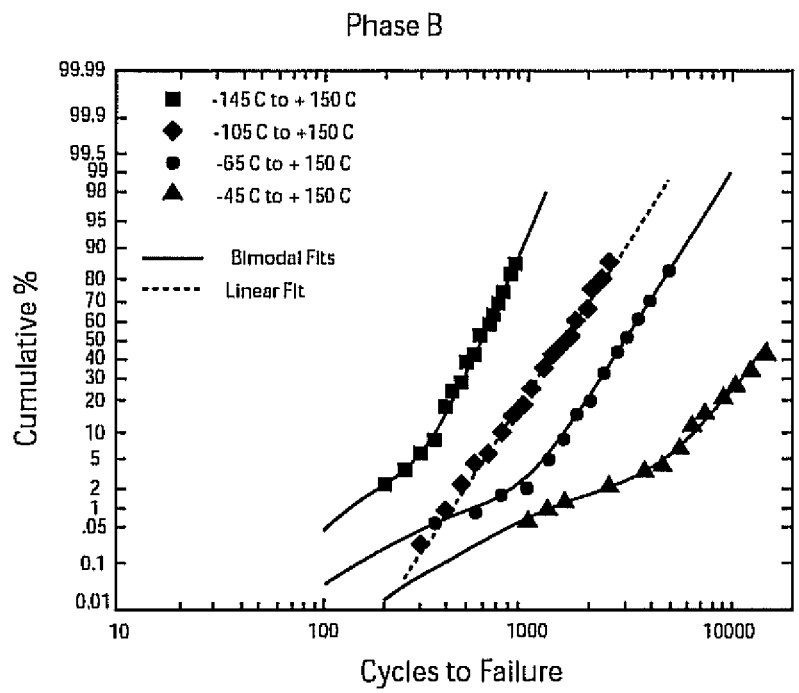
FIG. 4 is a lognormal CDF plot of cumulative percent of thermal cycles versus cycles to failure for an illustrative liner process (phase B) showing bimodal and linear fits.

Referring to FIG. 4, a lognormal CDF plot in terms of the cycles to failure for different temperature ranges from the phase B hardware is illustratively shown. FIG. 4 shows good agreement between the bimodal fits and the actual failure data. Note that only late failures occur for the −105° C. to +150° C. stress cell, so a linear fit based on the two-parameter lognormal distribution is indicated for this data.

Reliability projections based on the early failures are clearly more important than those based on the late failures. Since thermal cycle experiments are time consuming, it is desirable to have a means of predicting the relative number of early fails that will occur at normal operating conditions. Various BEOL processes, such as SiLK™ cure, liner degas and oxide deposition, subject wafers to temperature cycles. These processes may introduce defects into the test structures, where relatively large defects will affect the test structure yield and relatively small defects will affect the test structure reliability during thermal cycle stress.

The early fails that occur during stress are probably caused by reliability defects in the test structure. The yield of a test structure due to random defects follows Poisson statistics $Y=Y_0 e^{-L/Ay}$, where Y is the fraction of samples with no yield defects, $Y_0$ is the yield for nonrandom defects, L is the defect density and Ay is yield critical area for the structure, which is a mathematically-derived quantity for the probability that a defect will cause a yield failure.

If the same mechanisms responsible for yield defects are also responsible for reliability defects in the test structure, then a relation can be constructed for the reliability $R=R_0 e^{-L/Ar}$, where R is the fraction of samples with no reliability defects, $R_0$ is the reliability for nonrandom defects and Ar is the reliability critical area for the structure. Therefore, the following relationship exists between yield and reliability $R=(R_0/Y_0)Y^k$, where k=Ar/Ay is the ratio of the critical areas for reliability and yield.

Figure 5:
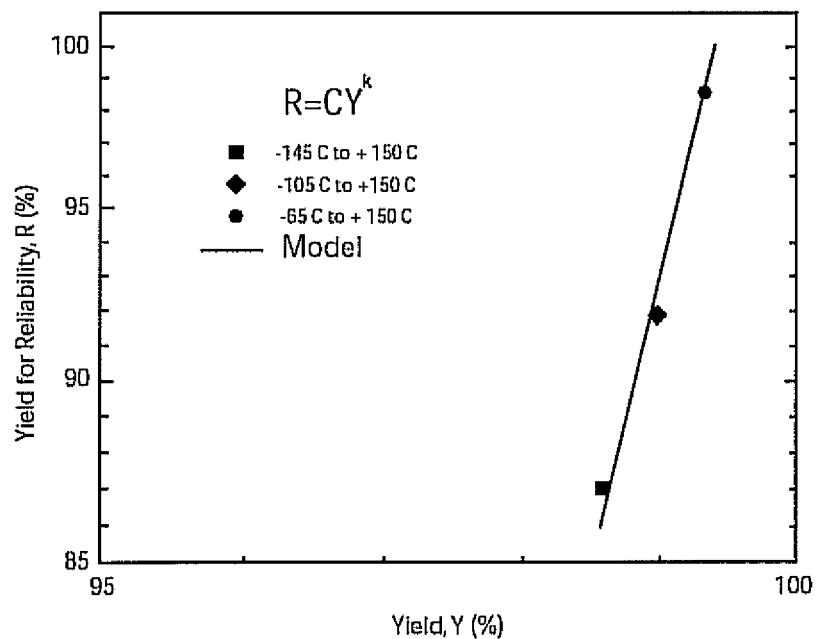
FIG. 5 is a log-log plot of reliability yield (%) versus yield (%) for phase A data showing a relationship therebetween in accordance with the present invention.

If the nonrandom terms are equal (e.g., $Y_o=R_o=1$), then $R=Y^k$. If a correlation exists between yield and reliability, then the same mechanisms are responsible for yield defects as well as reliability defects for the structure. If this is true, then reducing the process yield defects would reduce the reliability defects. To verify the validity of this model, a log-log plot of R versus Y should give a linear relationship. This is illustrated in FIG. 5. It should be noted that the relationship between yield and reliability is further described in "Reliability Defect Detection and Screening during Processing—Theory and Implementation", HANCE H. HUSTON and C. PATRICK CLARKE, IEEE/IRPS, January 1992, pp. 268-275.

Referring to FIG. 5, good agreement exists between the model, given by the solid line, and the actual data for the phase A hardware. Here, Y refers to the yield of structure 10 (FIG. 1), and R refers to the defect reliability of structure 10 (FIG. 1). Clearly, a larger fraction of samples with no yield defects corresponds to a larger fraction of samples with no reliability defects. Presumably, a sample with no reliability defects will not exhibit early fails during thermal cycle testing. In comparing the different processes, the phase A hardware produces a larger fraction of early fails compared to the phase B hardware. This result correlates with the fraction of samples with yield defects, as illustrated by the log-log plot of R versus Y in FIG. 6.

Figure 6:
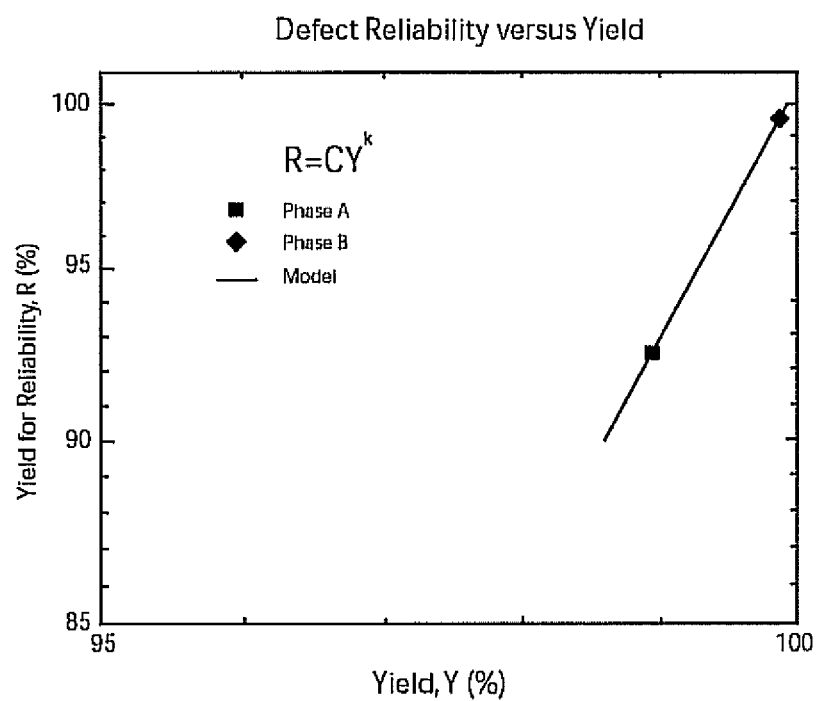
FIG. 6 is a log-log plot of reliability yield (%) versus yield (%) for phase A and phase B data showing a relationship therebetween in accordance with the present invention.

Referring to FIG. 6, the difference between the phase A and phase B processes is probably caused by variation in liner thickness. The idea is that samples with a thicker liner are less likely to have defects, and thus are less susceptible to early failures during thermal cycle stressing. The liner may be thought of as sharing the stress in the stacked via structure with the metal, such as, Cu. The liner materials have a higher bulk modulus and a higher yield stress than Cu. Therefore, a thicker liner means there is more structural support in the stacked via structure. Although there may be other factors that affect the defect reliability (grain size, via dimensions, etc.), the liner thickness is the most likely source of the differences, particularly since the phase B hardware was designed to have a thicker liner than the phase A hardware.

Based on this data, the present invention includes using the yield to monitor the thermal cycle reliability of chips during the manufacturing process. This includes measuring the yield of a simple kerf structure during the manufacture of the BEOL structure of the chip. The correlation between yield and reliability, such as that shown in FIGS. 5 and 6, would have already been generated for the process by using standard thermal cycle tests. The yield of the structure could then be used as a direct indicator of thermal cycle performance expected from the process.

Structure for Evaluating the Thermal Cycle Performance

Figure 7:
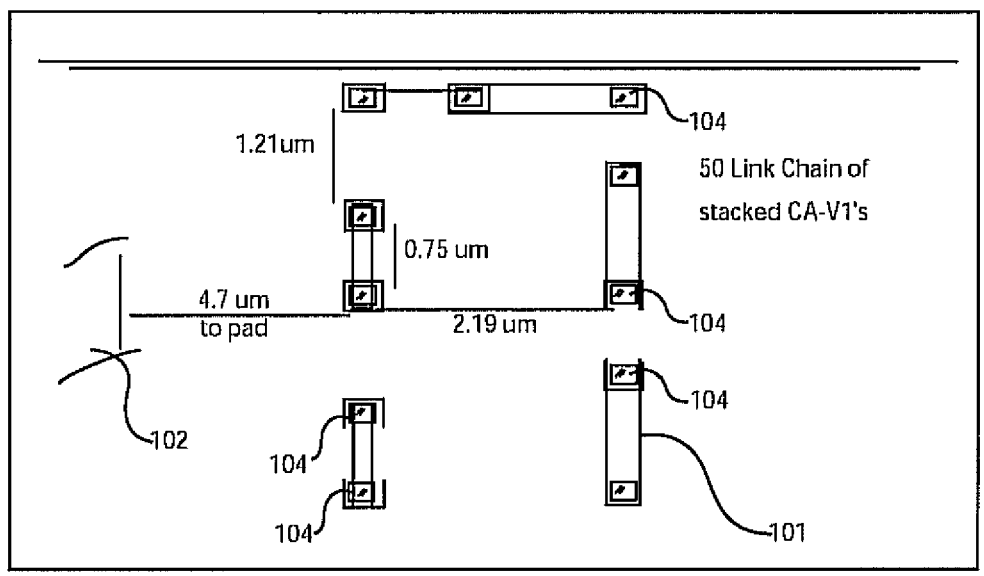
FIG. 7 is a layout view for a portion of an illustrative 50-link chain comprising stacked vias (into the page) employed as a test structure for one embodiment of the present invention.

Referring to FIG. 7, an illustrative layout 100 of a stacked via chain 101 used in an illustrative test structure is shown indicating the distance to a bond pad 102 as well as distances between vias 104 in the chain 101. The dimensions shown in FIG. 7 are for illustration purposes only. Other dimensions may also be employed. The effect of M1 on thermal cycle performance can be determined if designs with different M1 sizes are made available.

Referring to FIG. 8A, an extension of the structure 10 for stacked via macros with uniform via strain is illustratively shown. Dummy stacked vias 202 are not electrically connected to structure 204 which includes a test structure (e.g., see FIG. 1) and can reduce variation in strain at corners or end vias. By providing dummy structure 202 end effects or increased strain caused by thermal expansion mismatch between metal and dielectric (e.g., Cu and SiLK™) is reduced and made mode uniform within chain 204.

To increase the number of stacked vias per macro, the structure 204 can be lengthened or wrapped using, e.g., sections 206 in a serpentine manner (sections are separated by a sufficiently large distance). These dummy or wrapped structures may be employed to increase or reduce strain for particular designs and may provide uniformity for via chains used to measure yield and therefore reliability in accordance with the present invention.

Referring to FIG. 8B, a cross-sectional view of chain 204 is illustratively shown as a 6-level structure. Vias 208, 210 and 212 in this embodiment are arranged such that the smallest via sizes exist in the lowest level of metallization (closest to the devices) and increase with increasing levels of metallization. This practice leads to non-uniform strain in the vias. Thus, note the difference in size from bottom portions to top portions of the column. In addition, the size of the vias is affected by the material in which the vias are embedded. Vias 208 (in SiLK™ 14) are smaller in size than vias 210 (in silicon dioxide 16), and via 212 (in silicon dioxide 24) is the smallest in size. However, because via 212 is deposited in silicon dioxide, it will not be subject to the large strain caused by the thermal expansion of the SiLK™ dielectric. In this configuration, the lowest of the vias (208) in SiLK™ which correspondingly possesses the smallest cross-sectional area, will be the via that possesses the largest strain and hence will be the most likely location for cracking.

The geometry of the structure (e.g., vias, interfaces between vias and metal lines, etc.) may be designed to provide uniform strain at a highest level to induce failures or a change in performance characteristics of the structures. For uniform strain designs, strain values may be maintained within ±5% of a target or maximum value.

Figure 9:
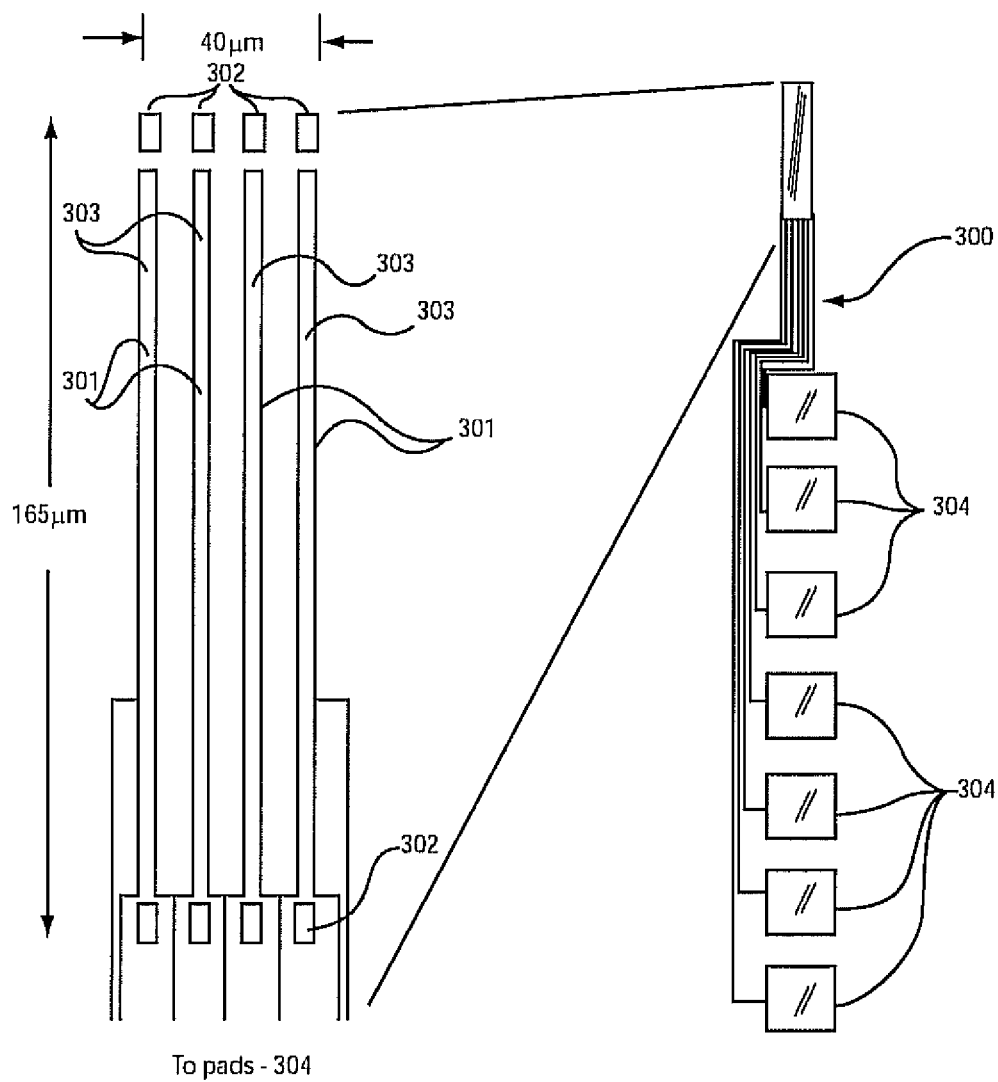
FIG. 9 is a layout of a wrapped via chain having uniform strain and multiple taps along the chain in accordance with one embodiment of the present invention.

Referring to FIG. 9, a wrapped stacked via chain 300 which may include e.g., 1000 stacked vias 303 and four sections 301 is illustratively shown in accordance with one embodiment of the present invention. Multiple taps 302 run from a specific number of vias along the chains. For example, the number of vias tapped may be, for example, 50, 250, 500, 750 and 1000. The number of taps depends on the number of available bond pads 304. The taps 302 are employed to provide contact points for determining failures or to make resistivity or other electrical measurements of the chain. Dummy stacked vias are not electrically connected to structure 300 which includes a test structure (e.g., see FIG. 1) and can reduce variation in strain at corners or end vias. By providing dummy structure end effects or increased strain caused by thermal expansion mismatch between metal and dielectric (e.g., Cu and SiLK™) is reduced and made mode uniform within chain 300.

If the design has bond pads 304 adjacent to a macro 300, it would be advantageous to separate the macro from the bond pads 304 by a certain distance (e.g., 40 microns or greater) due to thermal expansion effects from the Cu bond pads. Depending on the number of levels of metal as well as the actual via sizes, it is possible to design many different types of stacked via chains that all maintain uniform via strain and allow for the testing of multiple vias. Stacked via strain modeling may be implemented in accordance with, for example, but not limited to, the teachings of U.S. patent application Ser. No. 10/726,140, entitled "Building Metal Pillars in a Chip Structure Support", filed on Dec. 2, 2003, assigned to the assignee herein, and incorporated by reference herein in its entirety.

Sections or lines 301 in the design may have uniform strain throughout stacked via chains in that section or line. Strain is preferably designed into the part by employing geometric relationships of vias, thickness of liner and dielectric layer, spacing between vias, material properties, etc.

In one embodiment, distances between the structure 300 and the bond pads (or regions of high metal fill density) is such that the reduction in thermal strain of any via is preferably less than 5% compared to the maximum value of thermal strain that exists between the metallization and insulator for a completely isolated via. Multiple sections of vias may be electrically connected and separated by a sufficient distance (>7 µm) to reduce the thermal expansion effects caused by adjacent vias The distance between the sections 301 may be such that the reduction in thermal strain of any section is less than 5% compared to the maximum value of thermal strain that exists between the metallization and insulator for a completely isolated section of vias.

Analytical modeling of the mechanical behavior of this wrapped stacked via chain, with dimensions corresponding roughly to FIG. 1 and those depicted in FIG. 8, indicates that the value of strain in the vias is approximately 80% of that produced by the thermal mismatch between say, Cu and SiLK™. The value of via strain is dependent on several factors, including total SiLK™ thickness and thickness of the overlying oxide passivation cap as well as the aforementioned metal fill fraction and via spacing. The value of via strain can be tailored within alternate stacked via chain designs by adjusting any one of these parameters. For example, to increase the probability of via failure, one can create a via chain design in which the vias are exposed to the maximum strain.

For a 6-level SiLK™ build with the cross-section depicted in FIG. 8, each of the vias may be positioned 7 microns apart along the chain. If a serpentine chain is employed, the adjacent sections should also be at least 7 microns apart to ensure the maximum via strain of approximately 97% of the Cu/SiLK thermal mismatch.

In one embodiment, it would be preferred to maintain the strain values within a 5% tolerance of a maximum strain value, Maximum strain may be arbitrarily defined or may use a reference within the test structure. For example, a single isolated via would include the most strain and the value thereof may be used as this maximum. Other strain configurations are also contemplated.

Although the results discussed previously apply to Cu metallization and a SiLK™ dielectric, the same methods can be applied to other combinations of materials. A mismatch in CTE should exist between the metallization and surrounding insulator and the liner material should have a higher modulus compared to the metal.

Figure 10:
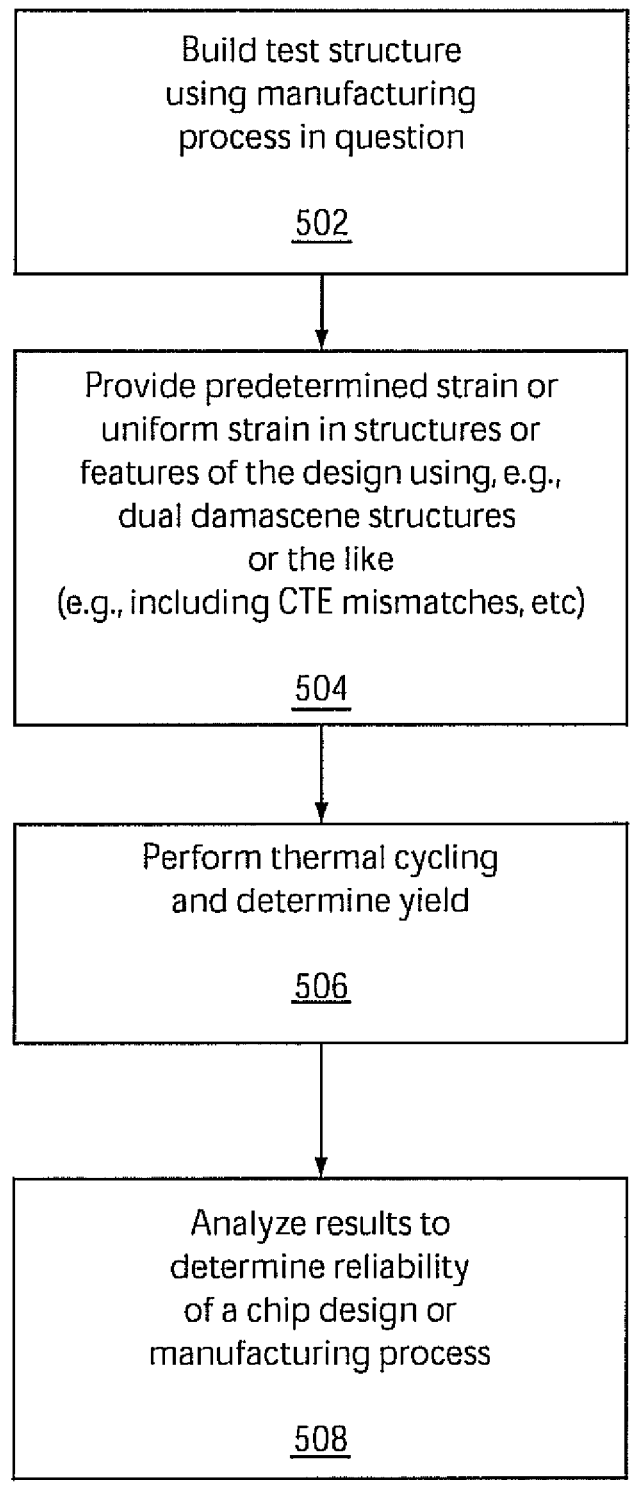
FIG. 10 is a flow diagram of an illustrative method for predicting reliability of a semiconductor device structure based on the test structure in accordance with the present invention.

Referring to FIG. 10, by creating test structures in accordance with the present invention, thermal cycling responses on an entire chip design can be achieved. For example, a chip layout may be designed and mimicked by forming a test structure using the same manufacturing process contemplated for the design in block 502. The design may be incorporated into existing chip designs or by a separate manufacture.

In block 504, via chains are preferably formed to maximize stress/strain in the vias to cause a measurable failure or change in electrical characteristics after thermal cycling tests. Alternately, strain values may be made uniform throughout a design or varied by increasing or decreasing the frequency of via chains along a length of the chip. The number, size, pattern and materials of the vias and their surrounding may be varied to provide predetermined strain in each structure.

In one embodiment, the metal is preferably patterned using a Dual Damascene process with conductive liners along the bottoms and sidewalls of the vias, where a dielectric material surrounds the metal, and where a mismatch in the coefficient of thermal expansion (CTE) exists between the metallization and surrounding insulator.

In block 506, thermal cycling is performed on the test structure or chip to achieve early failures or changes in electrical characteristics. A yield parameter is determined. The yield or the relative number of electrically functional structures following chip fabrication is used to determine the thermal cycle reliability of the structure at a given stress condition.

In block 508, the results of the thermal cycle tests are analyzed to gain a general understanding of the reliability achievable for a particular design. The yield or yields of various structures can be employed to evaluate the reliability of given structures in a design. The thermal cycle reliability refers to the relative number of structures that do not exhibit early fails during thermal cycle testing.

Thermal cycle failure is less of an issue for materials with CTE relatively matched, for example, aluminum (Al) metallization with $SiO_2$ as the dielectric. Here, the mismatch in CTE between the metallization and the dielectric is not large enough to cause failure.

Only recently have chip performance requirements led to the use of Cu metallization and organic low-k dielectric materials, where the mismatch in CTE is quite large. Therefore, the yield on the thermal cycle reliability for properly designed test structures in accordance with the present invention is employed to reject chip designs, portions of designs or provide a strong indicator of overall reliability of a chip design or manufacturing process.

Having described preferred embodiments of a method and structure for determining thermal cycle reliability (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A test structure used to determine reliability performance, comprising:
    a patterned metallization structure having a plurality of interfaces in a semiconductor structure, which form stress risers, the metallization structure including at least one of:
        a via chain formed through layers of patterned metallization in the semiconductor structure such that a plurality of widths of vias are sued to adjust strain in different layers; and
        a dummy structure formed to provide a via density in an area of the semiconductor structure to adjust strain in adjacent structures of the test structure; and
    a dielectric material surrounding the metallization structure, where a mismatch in coefficients of thermal expansion (CTE) between the metallization structure and the surrounding dielectric material exists such that failures occur under given stress conditions to provide a yield indicative of reliability for a manufacturing design.

2. The structure as recited in claim 1, wherein the same strain value is across a plurality of vias in the test structure.

3. The structure as recited in claim 1, wherein the patterned metallization structure includes a dual damascene structure.

4. The structure as recited in claim 1, further comprising conductive liners along bottoms and sidewalls of vias in the dual damascene structure.

5. The structure as recited in claim 4, wherein the liners include one of tantalum (Ta), tantalum nitride (TaN), titanium (Ti), titanium nitride (TiN) and tungsten (W).

6. The structure as recited in claim 1, wherein the metallization structure includes one of aluminum (Al), copper (Cu), Gold (Au), silver (Ag) and alloys thereof.

7. The structure as recited in claim 1, wherein the dielectric material includes an organic material.

8. The structure as recited in claim 1, wherein the dielectric material includes one of a SiLK (trademark of Dow Chemical) organic dielectric, polyamide, SiCOH, a nitride and an oxide.

9. The structure as recited in claim 1, wherein the mismatch in CTE between the metallization structure and the dielectric material is greater than about 20 ppm/° C.

10. The structure as recited in claim 1, wherein the metallization structure includes a stacked via chain having at least two levels of interconnects and vias.

\* \* \* \* \*